US011418879B2

(12) United States Patent
Luyten et al.

(10) Patent No.: US 11,418,879 B2
(45) Date of Patent: Aug. 16, 2022

(54) AUDIO SIGNAL BLENDING WITH BEAT ALIGNMENT

(71) Applicant: NXP B.V., Eindhoven (NL)

(72) Inventors: Joris Louis L Luyten, Begijnendijk (BE); Temujin Gautama, Boutersem (BE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/931,398

(22) Filed: May 13, 2020

(65) Prior Publication Data
US 2021/0360348 A1 Nov. 18, 2021

(51) Int. Cl.
H04R 3/04 (2006.01)
G06F 3/16 (2006.01)
G11B 27/038 (2006.01)
H03M 1/34 (2006.01)

(52) U.S. Cl.
CPC .............. H04R 3/04 (2013.01); G06F 3/165 (2013.01); G11B 27/038 (2013.01); H03M 1/34 (2013.01)

(58) Field of Classification Search
None
See application file for complete search history.

(56) References Cited

U.S. PATENT DOCUMENTS

| 6,590,944 B1 | 7/2003 | Kroeger | |
|---|---|---|---|
| 6,718,309 B1* | 4/2004 | Selly | G10L 21/01 341/61 |
| 7,767,897 B2 | 8/2010 | Jochelso et al. | |
| 2004/0254660 A1* | 12/2004 | Seefeldt | G10H 1/40 700/94 |
| 2007/0291876 A1 | 12/2007 | Shridhar et al. | |
| 2013/0003904 A1* | 1/2013 | Elenes | H04H 40/18 375/350 |
| 2016/0049155 A1* | 2/2016 | Siemes | G10L 21/0316 704/500 |
| 2016/0119066 A1 | 4/2016 | Oldewurtel et al. | |
| 2017/0302432 A1 | 10/2017 | Kroeger et al. | |
| 2019/0042647 A1* | 2/2019 | Oh | G06F 16/636 |
| 2021/0012784 A1* | 1/2021 | Fotopoulou | G10L 25/06 |
| 2021/0072381 A1* | 3/2021 | Crouch | G01S 17/34 |

FOREIGN PATENT DOCUMENTS

EP 3386126 A1 10/2018

* cited by examiner

Primary Examiner — Walter F Briney, III

(57) ABSTRACT

A method and apparatus are described for aligning cross-faded audio signals using beats. In an embodiment, a controller includes a cross-fade module having at least first and second audio inputs and an audio output port to provide an audio output signal to an external audio reproduction system. A control signal determines whether to provide the first or the second audio signal to the audio output, and the cross-fade module cross-fades the audio output signal from one audio signal to the other audio signal. A beat alignment module determines a delay between a first beat of the first audio signal and a second beat of the second audio signal, and a delay module delays either the first or the second audio signal to compensate for the delay into the cross-fade module.

20 Claims, 4 Drawing Sheets

AUDIO SIGNAL BLENDING WITH BEAT ALIGNMENT

BACKGROUND

Music consumption is offered direct to the consumer using many different technologies and formats. Analog radio broadcasting using AM (Amplitude Modulation) and FM (Frequency Modulation) is still offered in many markets. Digital radio broadcasting uses the same frequency band, e.g. IBOC (In-Band On-Channel) broadcast, or other bands to provide the same or similar programming to what has been available from analog radio. However, the signals are encoded in the digital domain, as opposed to traditional analog modulation. Internet radio services offer similar programming as a multi-cast or single cast through Internet connections and mobile telephony services to computers and mobile devices. Some broadcasters also use satellite transmission to deliver a program throughout a broad region or across a country. There are specific audio-only satellite services and there are direct broadcast television satellite services that also broadcast music channels.

In many cases, the same single program will be transmitted as an Internet radio stream, a digital broadcast on satellite, terrestrial radio waves, or both, and an analog broadcast. In some cases, the analog broadcast is offered with both AM and FM signals. This is sometimes referred to as simulcast. A listener may be able to access all of these sources of the same programming with a single device. In addition, in some cases the same program may be broadcast from different transmitting antennas in different cities. Currently many vehicle in-car entertainment systems offer analog, digital terrestrial, and digital satellite tuners together with a mobile telephony network connection all from one device and one control panel. Home and business systems also offer a choice of different sources, such as analog radio, digital broadcast radio, and digital Internet radio.

The digital radio audio signals have advantages over their analog counterparts, such as reduced noise, and a better robustness to radio interferences (e.g. multi-path interference, co-channel noise, etc.). The digital Internet music services offer advantages, such as still better reception as long as the receiver is near a base station. The analog radio audio signals have advantages such as a lack of digital data compression and longer range from the transmitter. Analog signals also tend to degrade gradually so that as a receiver moves away from the transmitter, the analog program may be comprehensible, albeit with noise, after the digital signal can no longer be successfully received. As a receiver moves relative to the transmitters and as the radio propagation environment changes, one source of the program may become better than another source of the same program. In such circumstances, the receiver can switch from one source to another. The transition can be made more pleasant to the listener using a cross-fade in which the volume of the old source is slowly decreased while the volume of the new source is slowly increased.

SUMMARY

A method and apparatus are described for aligning audio signals using beats. In an embodiment, a controller includes a cross-fade module having a first audio input port to receive a first audio signal, a second audio input port to receive a second audio signal, an audio output port to provide an audio output signal and configured to be connected to an external audio reproduction system. A control input port receives a control signal used to determine whether to provide the first audio signal or the second audio signal to the audio output port, and the cross-fade module cross-fades the audio output signal at the audio output port from one audio signal to the other audio signal. A beat alignment module determines a delay between a first beat of the first audio signal and a second beat of the second audio signal, and a delay module receives the delay and delays at least one of the first audio signal and the second audio signal to compensate for the delay before the at least one of the first audio signal and the second audio signal are received at the respective audio input port.

In an embodiment, the first audio signal and the second audio signal represent a same program received at different times through different transmission media.

In an embodiment, the control signal has a first mixing factor for the first audio signal and a second mixing factor for the second audio signal and the control signal increases the first mixing factor while decreasing the second mixing factor to transition the audio output to the first audio signal.

In an embodiment, the beat alignment module determines the delay using a cross-correlation of the first audio signal and the second audio signal.

In an embodiment, the controller further includes a time to frequency domain converter connected to receive the first and second audio signals and send frequency domain first and second audio signals to the beat alignment module, wherein the beat alignment module performs a cross-correlation in the frequency domain, and a frequency to time domain converter connected to receive the cross-correlation, wherein the beat alignment module determines the delay from the cross-correlation in the time domain.

In an embodiment, the controller monitors a signal quality of the first audio signal and the second audio signal and sends a control signal to the cross-fade module to switch to one of the first audio signal or the second audio signal based on the monitoring.

In an embodiment, the controller monitors an error rate of each respective signal as the signal quality.

In an embodiment, the beat alignment module correlates the first audio signal and the second audio signal to determine a delay corresponding to a time distance between beats of the first and second audio signals.

In an embodiment, the controller also includes an analog radio tuner to receive an analog radio broadcast, an analog-to-digital converter to convert the received analog radio broadcast to the first audio signal, and an internet radio receiver to receive an internet radio broadcast and produce the second audio signal.

In an embodiment, a method is disclosed which includes receiving a first audio signal at a first audio input port of a cross-fade module, receiving a second audio signal at a second audio input port of the cross-fade module, receiving a control signal at a control input port of the cross-fade module, determining a lag between a first beat of the first audio signal and a second beat of the second audio signal, delaying at least one of the first audio signal and the second audio signal before it is received at the respective audio input port to compensate for the determined lag, and reducing the output amplitude provided at an audio output port of the cross-fade module from the first audio signal while increasing the output amplitude of the second audio signal in response to the control signal, the audio output port configured to be connected to an external audio reproduction system;

In an embodiment, the method further includes generating the first audio signal by receiving an analog broadcast, converting the analog broadcast to an analog audio signal, and converting the analog audio signal to the first audio signal.

In an embodiment, determining a lag comprises cross-correlating the first audio signal against the second audio signal at different lags to determine a lag with a highest correlation.

In an embodiment, determining a lag comprises determining a lag with an integer number of beats between audio of the first audio signal and audio of the second audio signal.

In an embodiment, the first beat and the second beat are downbeats of audio of the first and second audio signals, respectively.

In an embodiment, determining a lag comprises cross-correlating the first audio signal in a frequency domain representation against the second audio signal in a frequency domain representation and converting the cross-correlation to a time domain representation to determine a lag using the cross-correlation.

In an embodiment, determining a lag comprises comparing peaks at different times on the time domain cross-correlation.

In an embodiment, a radio receiver is disclosed. The radio receiver includes a first radio tuner to receive an analog radio broadcast, an analog-to-digital converter to convert the received analog radio broadcast to a first audio signal, a second radio tuner to receive a second radio broadcast and produce a second audio signal, a cross-fade module coupled to the first audio signal and to the second audio signal to switch between the first or the second audio signal as an audio output signal using a cross-fade, a beat alignment module coupled to the first audio signal and to the second audio signal to determine a delay between the first audio signal and the second audio signal to align beats of the respective signals, and a delay module to receive the delay and to delay the second audio signal using the determined delay of the beat alignment module.

In an embodiment, the radio receiver further includes a time to frequency domain converter connected to receive the first and second audio signals and send frequency domain first and second audio signals to the beat alignment module, wherein the beat alignment module cross-correlates the frequency domain first and second audio signals, and a frequency to time domain converter connected to receive the cross-correlation and send a time domain cross-correlation, wherein the beat alignment module determines the delay using the time domain cross-correlation.

In an embodiment, the radio receiver further includes a controller to select the first audio signal or the second audio signal, and wherein the cross-fade module switches between the first and the second audio signals in response to a control signal from the controller.

In an embodiment, the controller compares audio signal quality of the first audio signal and the second audio signal to generate the control signal to the cross-fade module to switch to one of the first audio signal or the second audio signal based on the audio signal quality comparison.

DETAILED DESCRIPTION

It will be readily understood that the components of the embodiments as generally described herein and illustrated in the appended FIGS. could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

Figure 1:
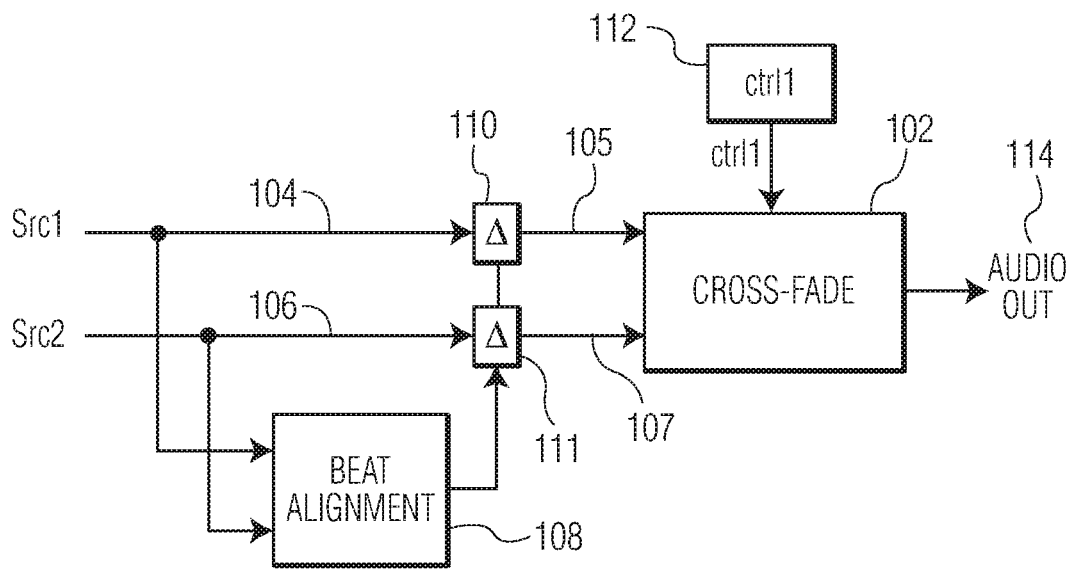
FIG. 1 depicts a cross-fading system with beat alignment.

FIG. 1 is a diagram of a cross-fading system with beat alignment according to embodiments. A cross-fade module 102 has a first and a second input port to each receive one of two different audio signals 104, 106, one from a first source, Src 1, and the other from a second source, Src 2. There may be many more sources and these sources may correspond to any of the sources discussed herein, inter alia. The cross-fade module 102 produces one or the other or both of the two audio signals 104, 106 as an audio output 114 at an audio output port as determined by a selection controller 112. When switching from one audio signal to the other, the cross-fade module 102 fades out the one signal and fades in the other signal to create a smooth transition as the audio output 114. The amplitude of one of the digital audio input signals is reduced to zero and the amplitude of the other signal is increased to full.

A beat alignment module 108 also receives the two audio signals 104, 106 at respective first and second input ports and generates a delay for one or more variable delay gates 110, 111. The delay gates 110, 111 are connected between the audio signals 104, 106 and the cross-fade module 102 to apply a delay to the respective input audio signal to compensate for the delay of the other input audio signal. There may be a delay gate on either one or both of the signals between the source and the cross-fade module 102. The delay cannot be corrected because it is caused by the broadcast timing of the signal and the operation of the reception equipment. Instead the delay is compensated for by beat-alignment, such that the transitions from one source to the other are less annoying for the user When two broadcasts for the same radio program are available (e.g., AM and FM of the same broadcast, digital and analog audio broadcast, or two digital broadcasts of the same program, such as multiple Internet providers or digital radio and Internet transmitters), then a receiver can switch from one to the other without changing programs. If the reception quality or sound quality of one is better than the other, then the listening experience can be improved by switching to the better broadcast.

Blending is used to make a change from one channel to another gentler or smoother. The blending engine including the cross-fade module 102 may be a part of an audio processing part of a receiver chip. For many receivers, the analog signals are digitized so that the blending is performed on a digitized version of the analog radio signal. When all the audio is digitized, then blending from DAB (Digital Audio Broadcast) or Internet radio to FM and vice versa is performed in the same way as blending from DAB to Internet radio because all the audio signals are digitized. The Internet provides opportunities for a diverse and changing array of music, video, and other services using different transmission and encoding systems. The names for these services change and compete with each other. In this description Internet radio is used to refer to any audio or video signal that uses a form of the Internet and provides the same programming as a terrestrial or satellite radio signal.

Even with a gentle fade from one broadcast to the other, the user may still notice that the two broadcasts are not synchronized. The audio broadcast streams are broadcast through different transmitters and through different media, so that they arrive at the receiver at different times. In some cases, a receiver may buffer a digital source before presenting the audio. This causes more delay. The delay is distracting and even annoying to the listener. This is especially the case if there is a long delay from one of the signals to the other. As an example, an Internet radio stream of a program may lag tens of seconds behind a DAB or analog broadcast of the same program.

One way to make the cross-fade more pleasant to the listener is to eliminate the delay by synchronizing the sources before the cross-fade. The blend from one source to the other will then seem to be seamless, i.e. without any apparent break or discontinuity in the music, to the listener. Digital sources will sometimes have a frame, timing, or sequence number that allows a system to directly align the two signals in time. However, it is not always possible or practical to synchronize the signals, especially if the receiver has limited computational and buffering resources. With a long delay, it may take too long to compute the delay between the sources. In addition, in order to synchronize the signals, one signal must often be stretched, i.e. played at a slower speed, to match the delay of the delayed signal. For a lag of tens of seconds, the stretching is typically done over the course of several minutes.

When it is not possible or practical to synchronize the signals, beat alignment may be used before cross-fading the signals. Beat-aligning improves the experience of listening to a cross-fade between programs, but does not require a long buffer or any knowledge of the frame numbers. A musical audio signal will typically have a repeating beat. Popular music is typically in 4/4 time with 90 to 120 beats per minute. There is a new beat each 0.75 or 0.5 seconds. In the 4/4 bar. a downbeat (beat 1 of 4) occurs every 3 or 2 seconds, respectively. Accordingly, even if the musical piece is tens of seconds out of synchronization, the downbeats will often be within 2 or 3 seconds of each other. When a cross-fade occurs between such beat-aligned signals, the user may notice that the two songs are at different places so that a few words of a lyric or notes of a melody may be skipped or repeated. However, when the beats are aligned, the transition is much less distracting than when the beats are not aligned.

As mentioned above, the audio signals 104, 106 are applied as inputs to input ports of the beat alignment module 108. The beat alignment module computes a lag or delay to be applied to the primary input 104 or to the secondary input 106. This computed delay is applied to a delay module 110, 111. Any suitable digital delay circuit may be used. The output of the delay module is a delayed version of the primary audio signal 105 or a delayed version of the secondary audio signal 107. The delayed signal is applied as an input to the cross-fade module 102. When the cross-fade module fades from the first signal 105 to the second signal 107. The beat on the output 114 of the cross-fade module stays consistent between the two input sources during and after the cross-fade, because one of the signals will be delayed to a timing that is beat aligned with the other of the signals.

While a delay 110, 111 is shown as being applied to both the primary 104 and the secondary 106 signals, the delay may also or alternatively be applied to only the primary input or to the secondary input. The cross-fade module 102 can switch or transition from the primary audio signal 104 to the secondary audio signal 106 and back again. The controller 112 determines when a switch occurs and which input signal is to be the output audio signal.

The controller 112 may command a transition from the primary 104 to the secondary 106 signal based on one or more programmed criteria. In some embodiments, the controller commands a switch from the primary audio signal to the secondary audio signal whenever the audio quality of the primary audio signal becomes worse than that of the secondary audio signal, e.g., due to corrupted frames in the primary audio signal. There may be a threshold, delay, or hysteresis applied by the controller to reduce the amount or frequency of switching from one signal to the other. The controller further controls the cross-fade module to transition from the secondary audio signal back to the primary audio signal when the primary audio signal has recovered and is again the signal with better audio quality. In some embodiments, the controller 112 commands a transition to the secondary audio signal 106 whenever the secondary audio signal quality reaches a specific quality threshold. In some embodiments, a user can program the controller to prefer one type of signal e.g. digital over another type of signal, e.g. analog so that the controller will command a switch to the preferred signal type when permitted by the reception quality of the preferred signal type.

Figure 2:
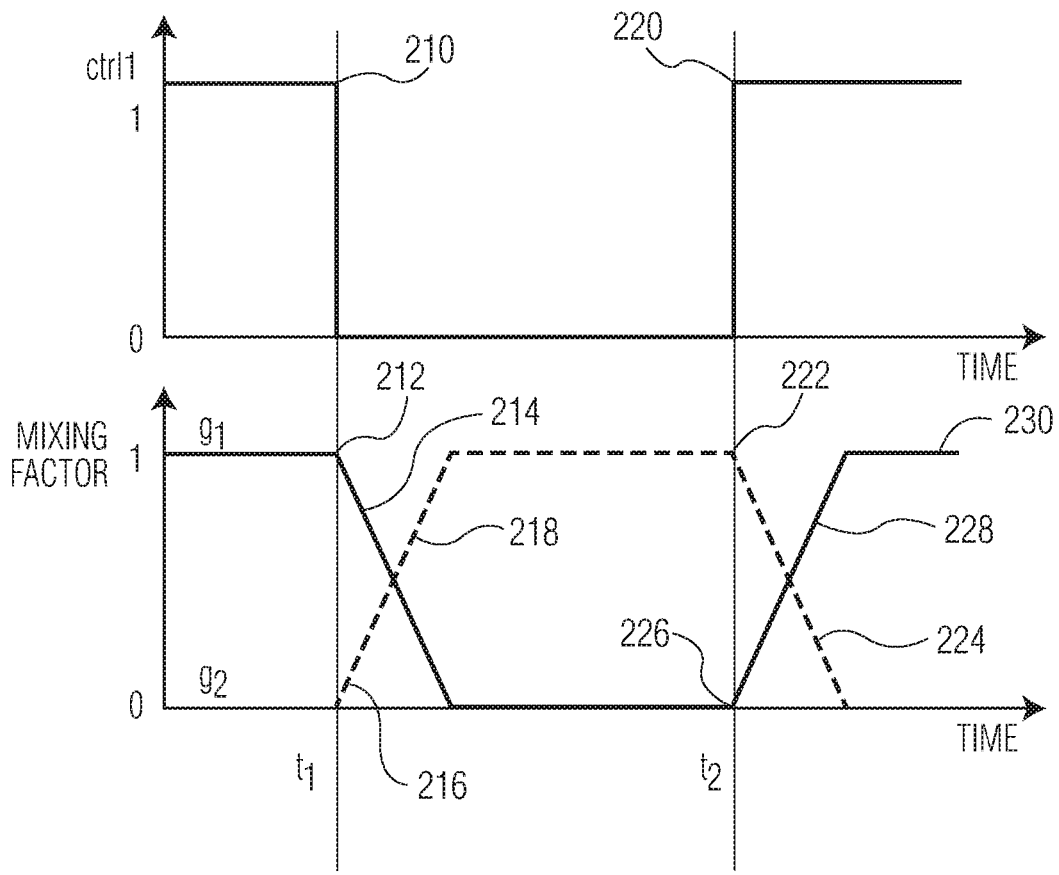
FIG. 2 illustrates timing of gain and control signals in a cross-fading system.

The cross-fade may be represented mathematically as in Eq. 1 where the output audio 114 is sout. The primary audio signal 104 is s1. The secondary audio signal 106 is s2 and g1 and g2 are mixing factors that vary over time. In the example of FIG. 2, the variation is a linear ramp from 0 to 1 and the slope of the variation is the same for both mixing factors g1, g2. for the two signals. In some embodiments, the mixing factor varies nonlinearly based on variances of human perception. The mixing factor g2 for the secondary input may be derived from the mixing factor g1 for the primary input as shown in Eq. 2.

$$sout = g1(*s1) + g2(*s2) \quad \text{(Eq. 1)}$$

$$g2 = (1-g1) \quad \text{(Eq. 2)}$$

FIG. 2 is a timing diagram of a representation of the state of the controller 112 input signal, ctrl 1, to the cross-fade module 102 on the upper graph. The upper graph shows signal state between 0 and 1 vertically on a horizontal time axis. The upper graph is aligned with a representation of the amplitude of the two mixing factors g1, g2 from 0 to 1 on the vertical axis on the lower graph. The change in the mixing factors over time is plotted on the horizontal time axis. These mixing factors g1, g2 are applied to the respective audio input signals s1, s2 to cross-fade the audio output sout as indicated in Equation 1.

In this example, the cross-fade module has two audio inputs, the primary audio signal 104 labeled as Src 1 and as s1, and the secondary audio signal 106, labeled as Src 2 and as s2, and one control input, ctrl 1. The control input, ctrl 1, indicates which of the two audio inputs is the target, e.g., 1 for the primary and 0 for the secondary audio input. In some embodiments, the control input is provided in response to an indicator of the signal with one or more characteristics, such as the better audio quality, the better signal quality, the lower noise level, the lower error rate, or in response to any other factors. While it has only two states in FIG. 2, there may be more audio signals and more states of ctrl 1. In some embodiments, the controller selects an audio channel with a look-ahead mechanism, so that the controller 112 generates the control signal in response to an advance warning of audio quality degradation of either of the signals.

The controller 112 monitors the quality of the received signals and can switch the output from one to the other as one gets worse and the other gets better or for any other suitable reason. In this example, the first switch happens at $t_1$ as indicated on the horizontal time scale and the second switch happens at time $t_2$. When ctrl 1 transitions from 1 to 0 at 210, the mixing factor g1 for the primary input signal Src 1 decreases 214 from 1 at 212 to 0, and correspondingly, the mixing factor g2 for the secondary audio signal Src2 increases 218 from 0 at 216 to 1. As a result, the output audio signal, 114, will smoothly cross-fade from the primary audio signal, Src 1, to the secondary audio signal, Src 2.

When ctrl 1 transitions from 0 to 1 at 220, the mixing factor g1 for the primary input signal Src 1 increases 228 from 0 at 226 to 1 at 230, and correspondingly, the mixing factor g2 for the secondary audio signal Src 2 decreases 224 from 1 at 222 to 0. As a result, the output audio signal 114 will smoothly cross-fade the amplitude of the secondary audio signal, Src 2, and the amplitude of the primary audio signal, Src 1 to reach the resulting output that is essentially only the primary audio signal Src 1. The time to transition from one signal to the other is determined by the slope of the two mixing factors g1, g2.

Figure 3:
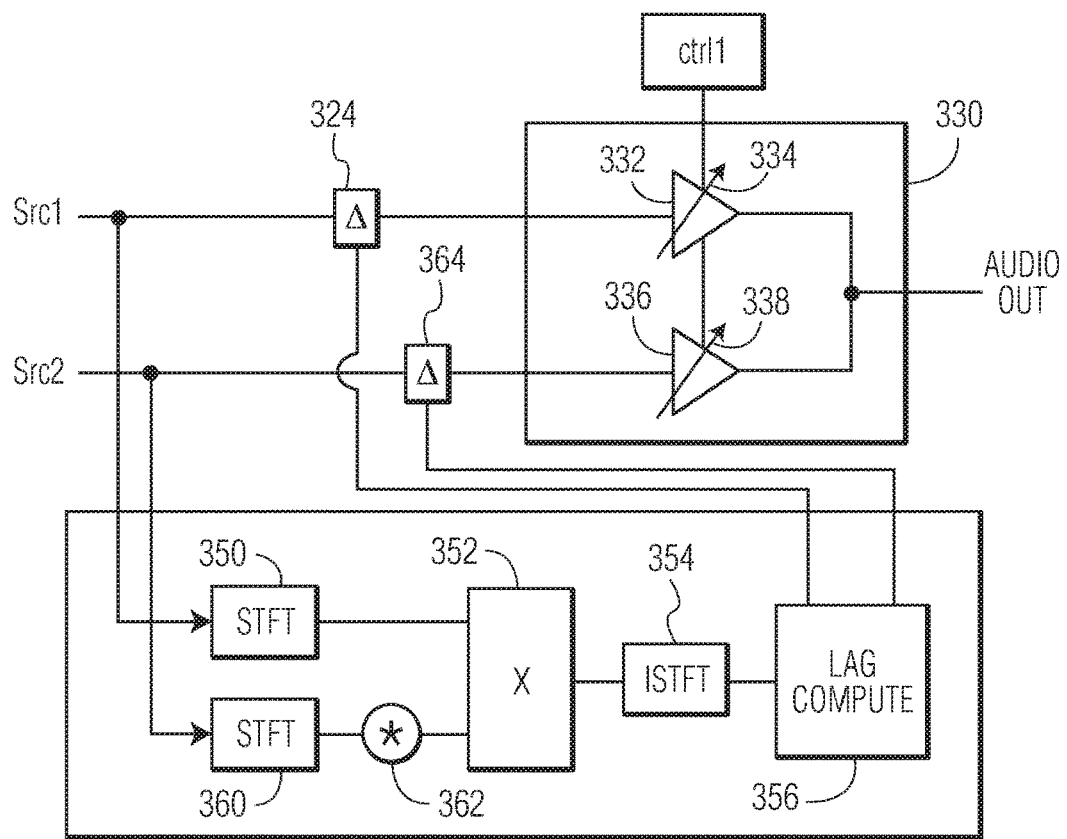
FIG. 3 depicts an alternative cross-fading system with beat alignment.

FIG. 3 is a block diagram of an alternative cross-fade module. Two received broadcast audio signals in the input are represented respectively by a primary audio signal Src 1 and a secondary audio signal Src 2. As in the context of FIG. 1, appropriate signal measurements have been applied by a signal processing circuit through ctrl 1 to determine an appropriate audio input signal choice prior to cross-fading the audio input signals.

A cross-fader circuit 330 has a variable gain amplifier 332 for the first audio input signal Src 1 and a second variable gain amplifier 336 for the second audio input signal Src 2. The variable gain amplifiers are each controlled by a respective variable control input 334, 338 so that as one of the control inputs increases the attenuation of one of the audio input signals. The other control signal decreases the attenuation of the other audio input signal. These control inputs are shown as variable gain sweep inputs, but a different or more complex input configuration may be used. The input voltage and the control signal conversion circuits are not shown for simplicity, but may be present in any implementation. The combined cross-faded output signal, Audio out, is sent to an external audio reproduction system for playback such as a sound module as described below.

Gradually changing the mixing factors as determined by attenuator or variable gain inputs 334, 338 during the blending operation provides a smoother transition from the primary to the secondary audio signal or vice versa. The time taken to change the mixing factors from 1 to 0 or 0 to 1, respectively, may be referred to as the cross-fade time.

The signals are aligned using a beat alignment module 322 coupled to the frequency domain representations of both inputs Src 1 and Src 2. A frequency domain representation of the respective primary audio signal Src 1 and secondary audio signal Src 2 is obtained by inputting the signals to respective time-to-frequency domain circuits 350, 360, such as STFT (Short-Term Fourier Transform) or FFT (Fast Fourier Transform) circuits. In some examples, a single time-to-frequency domain circuit may be employed. In the frequency domain, the primary audio signal Src 1 and secondary audio signal Src 2 are represented by their complex-valued frequency spectra, $Y1(\omega)$ for primary audio signal Src 1 and $Y2(\omega)$ for secondary audio signal Src 2, respectively, where $(\omega)$ represents frequency.

The beat alignment module uses a cross-correlation of the two input signals. While this may be done in the time domain, it is computationally simpler to perform the cross-correlation in the frequency domain. In the illustrated example, the cross-correlation is performed by first taking the complex conjugate at conjugation module 362 of one of the frequency domain representations, in this case Src 1. The frequency domain representation of the other signal, Src 2, can be is multiplied at multiplication module 352 with the complex conjugate of the FFT of the other signal, Src 1.

Figure 4:
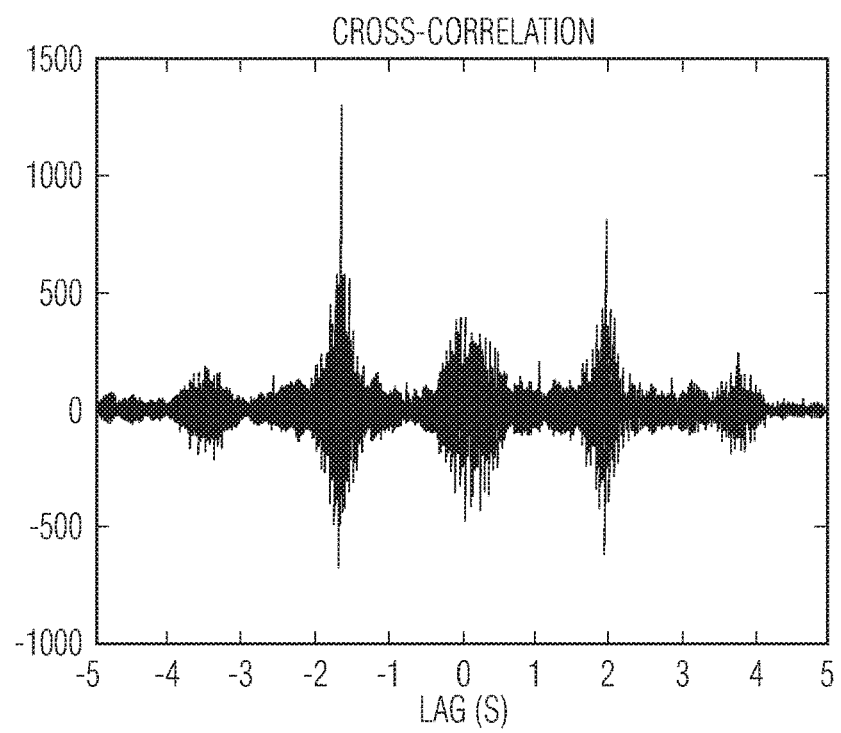
FIG. 4 illustrates a cross-correlation of two audio signals.

To determine the lag, the frequency domain correlation is first converted back to the time domain using a frequency-to-time domain circuit 354 such as an iSTFT (inverse STFT) or iFFT (inverse FFT) circuit IFFT. The time domain correlation, as exemplified in FIG. 4 is applied to a lag compute module 356 to locate the peak that corresponds to an estimate of the delay The lag compute module 356 of the beat alignment module 322 determines an appropriate delay for Src 1 and then applies that to a delay module 324 in the line for Src 1. The delay module will delay the audio signal before the cross-fade module 330 performs the transition from one signal to the other. The lag compute module may also or alternatively determine a lag for the second input signal Src 2 and send that to a second delay stage 364. The second delay stage 364 is in the line of the second audio signal Src 2 before the cross-fade module 330.

The beat alignment module 108 of FIG. 1 operates using time domain signals while the beat alignment module 322 of FIG. 3 uses frequency domain signals. The frequency domain conversions may be made within the beat alignment module or in some other part of the system. The beat alignment module sets the delay of the delay modules 110, 111, 324, 364 in such a way that the delay between the primary Src 1 and secondary Src 2 audio inputs to the respective cross-fade module 102, 330 corresponds to an integer number of beats in the music signal. The specific number of beats may be arbitrary. In some embodiments, the beats of the audio inputs are determined as the lag corresponding to a suitable peak in the cross-correlation between the input signals. The beat alignment may be implemented as cross-correlation in the time domain or the frequency domain or other beat alignment techniques may be used.

While the Fourier transform components 350, 360, 354 of the system are shown as being a part of the beat alignment module 322, this is not required. In some embodiments, the Fourier transforms are used for other purposes in addition to beat alignment and the conversions are prepared separate and apart from beat alignment. The particular components shown in FIG. 3 may be moved and incorporated into other components or moved out of components. The configuration is provided only as an example.

For many musical signals there is a measurable difference between the downbeat or first beat of a bar and the other beats. While most popular musical compositions are in 4/4 time, the downbeat is also often detectable with other time signatures. To align the downbeats, the beat aligner may detect beats and then perform a search to find the closest downbeat by comparing the detected beats to each other. In 4/4 time the downbeat is not more than three beats away from any one beat. Even in 6/8 time, the downbeat is no more than 5 beats away from any selected beat. The search range may therefore be limited to 5 beats for almost every musical genre. In some embodiments, the search range may be limited to 6+5=11 beats in case one of the signals has been corrupted enough to obscure a down beat. While aligning any two beats of the two signals will improve a sense of continuity for the listener, aligning the downbeats will make many cross-fades have enough continuity to be difficult to perceive without attentive listening. A beat-aligned delay that aligns the downbeats of two different audio signals may be called a bar-aligned delay.

As an example, FIG. 4 shows a cross-correlation between two beat-aligned and bar-aligned input audio signals. The graph represents the signals in the time domain in which the vertical scale is correlation of signal amplitude and the horizontal scale is lag. Although the delay between the signals is 20 seconds, the cross-correlation shows clear peaks for lags around 2 and −1.7 seconds. These lags are good candidates for a delay that renders the signals beat aligned.

With beat alignment and even with bar alignment, the listener may notice a transition from the one source to the other because the music may seem to skip or repeat a few bars. If the sources can be accurately synchronized, then there will be no skip or repeat during the transition. However, synchronization may be difficult or impossible in other situations. When one of the audio signals is an analog signal or when one of the audio signals is from a different packetizing or encoding system, then labeling may be missing or inconsistent. Finding the matching frames for synchronization may require significant resources of time and buffer memory because multiple frames must be closely analyzed and compared. The comparison may be imprecise if the reception of one of the signals is poor. If the delay is on the order of tens of seconds, synchronizing different sources may be difficult due to the large time distance between the two. In these cases, beat alignment is faster and requires less buffer to compare and delay the two signals. The required resources are able to meet much lower cost targets, especially for mobile consumer equipment.

Beat alignment makes it possible to limit the delay range to one or a few seconds regardless of the actual delay between programs. This allows for a faster and simpler result. The larger the delay between the signals, the more time it takes to compute and enforce the synchronization by filling the delay buffers. Beat alignment allows the signal to be switched before synchronization has completed. Beat alignment allows a best possible small delay to be selected and applied. In some cases, there may be no clear correlation between the signals within the delay time. In other cases, the delay obtained from the cross-correlation will be one that makes the signals beat aligned.

In the described applications herein, the same program is being sent over two different media. As a result, it easy to align the beats between different bars when the music is repetitive. Many nearby bars of a repetitive composition will have very similar content. These bars will match up well in a cross-correlation. Accordingly, a cross-correlation has been found to be sufficient in most cases. When a cross-correlation and a 3 second delay is not sufficient, then the entertainment system may use a more complex beat alignment mechanism or be configured to switch channels without the benefit of any beat alignment or synchronization.

Beat detection and alignment for musical signals is a long-standing problem and there are many papers and working systems that promote or employ a wide variety of different solutions. Many of these systems are directed to aligning two different musical recordings and even two different compositions that have different tempos. Accordingly, most such techniques may be used to good effect for the described embodiments even if they are more complex than necessary for most circumstances.

In one such system, the audio is decomposed into bands using filterbanks. Envelope detection is performed on each band. Resonant comb filters are then employed to test different candidate beat rates. The beats and beat rates are therefore isolated and may be compared to the beats of the second signal. In another such system, Fourier transforms are performed on the input audio, scalars are generated to represent spectral change in the frequency domain and areas of peak spectral change are identified as the beats. Other simpler and more complex beat detection techniques may be used herein.

In another such system, adaptive filtering is used as an alternative to cross-correlation. Normalized Least Mean Squares is a useful adaptive filtering technique in which the FIR (Finite Impulse Response) filter needed to transfer one signal into the other is estimated. The delay between the beats of the two signals can then be estimated as the delay corresponding to the largest coefficient (in absolute value) in the estimated filter. Due to the causality of the filters, 2 filters may be estimated, one for each direction (src1→src2 and src2→src1).

There are a variety of techniques to perform a cross-correlation. In one example, the cross-correlation is computed by convolving the two digital signals in the time domain. It requires significant processing resources to perform a full convolution of multiple seconds of the audio signals. Accordingly, approximations may also be used.

Figure 5:
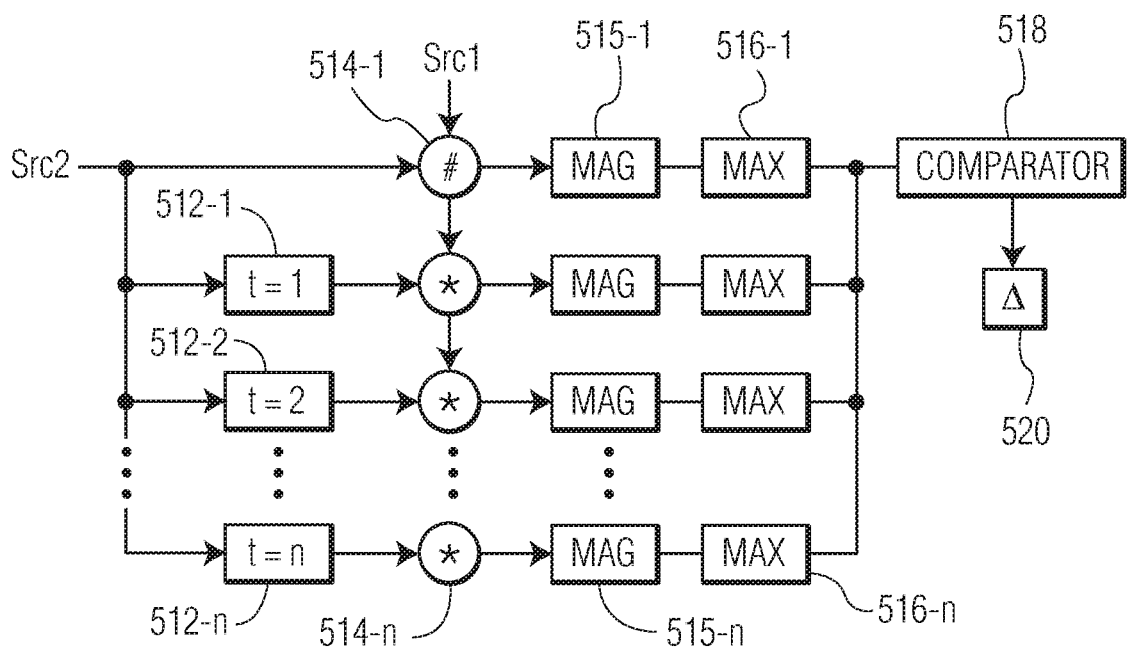
FIG. 5 is a block diagram of a beat alignment circuit.

FIG. 5 is a block diagram of a beat alignment circuit using cross-correlation. In this example, a sample or window over a specific time duration from the secondary audio signal Src 2 is applied to each of a sequence of multiple delay gates 512-1, 521-2 . . . 512-n. The output of each delay gate is a time-shifted portion of Src 2. Each time shifted portion may be truncated to have the same duration but a different start and end time. Each time-shifted portion of Src 2 is applied to a cross-correlator 514-1, 514-2, 514-3 . . . 514-n. As shown, the sample into the first cross-correlator is not delayed. A sample of the primary audio signal Src 1 with the same specific time duration is also applied to each cross-correlator. Each sample of Src 1 is the same and has the same start time as the first sample of Src 2. The sample of Src 1 is cross-correlated with each sample of Src 2 with n different delays or lags.

The result of each cross-correlation is evaluated to determine a magnitude for each result. First an absolute value is taken of each result in Abs blocks 515-1, 515-2, 515-3 . . . 515-n, then a maximum is determined by a max circuit 516-1, 516-2, 516-3 . . . 516-n for each absolute value by integrating, averaging, or summing the cross-correlator results. The magnitude values are applied to a comparator 518 to determine the greatest peak magnitude. This greatest magnitude corresponds to the closest or greatest correlation between all of the different delays or lags. The delay or lag corresponding to the cross-correlation with the greatest peak magnitude is selected as the delay 520 to be applied to the cross-fade module input.

While the example circuit performs the delay determination using parallel cross-correlation, it may also be configured to operate in series with a single cross-correlator to perform all of the cross-correlations for all of the time-shifted samples of Src 2. There may also be a process of testing multiple delays of Src 1. In some embodiments, the delay gates are each configured with a different coarse search value to find the closest coarse search delay and then based on the coarse search results, the delay gates are configured with a different fine search value to find the closest fine search delay.

The resulting lag value 520 depends on the difference in time of reception between the two signals. The primary contributor to this time of reception is the time of transmission and the encoding/decoding of the two signals which is determined by the broadcasting and reception equipment. As a result, the delay does not vary significantly over time. In the time that it takes to perform a cross-fade, the delay will not vary enough to matter. Even in the time that it takes to transmit a typical musical recording, e.g. 2:30 to 5 minutes, the delay will not vary significantly. Accordingly, the beat alignment circuit may determine the lag in advance of any cross-fade operation.

Figure 6:
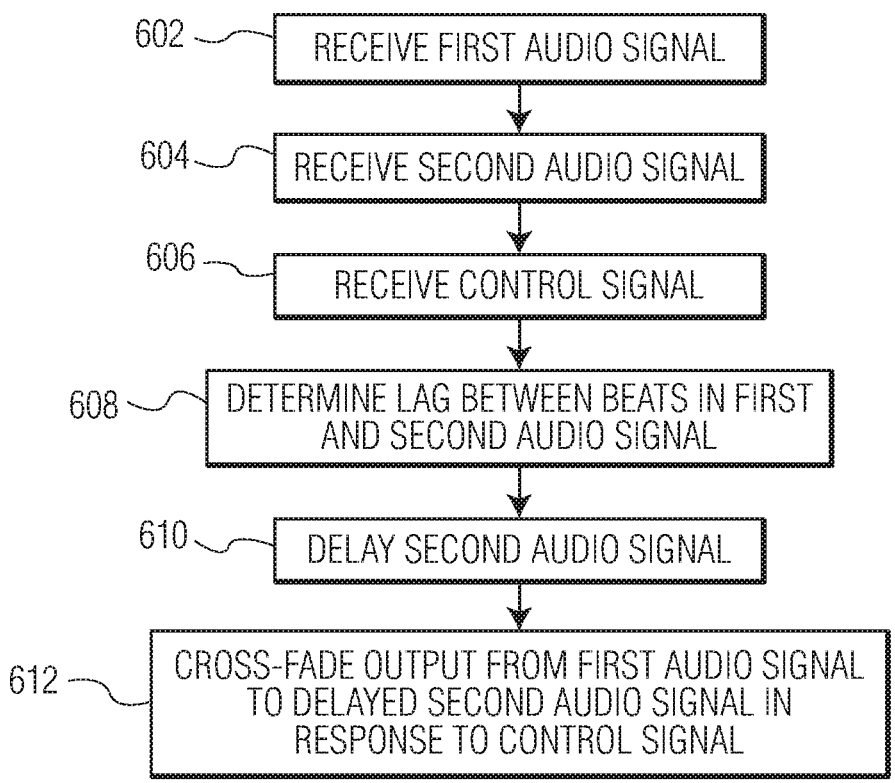
FIG. 6 is a process flow diagram of aligning beats for cross-fading audio signals.

FIG. 6 is a process flow diagram of beat alignment for cross-fading audio signals. At 602, a first audio signal is received. The signal is received through a tuner or Internet node and converted to a suitable digital form for use by a sound reproduction system. At 604, a second audio signal is similarly received and converted into a suitable digital form. At 606, a control signal is received by a cross-fade module from a controller. The control signal indicates a selection of either the first audio signal or the second audio signal to be produced from the cross-fade module to an audio output. The control signal may indicate the first or second audio signal only when the output is to be switched from one signal to the other. In this example the cross-fade module switches from the first audio signal to the second audio signal in response to the control signal.

At 608, a beat alignment module determines a lag between beats in first and second audio signal. The beats may be the closest beats between the two signals or the downbeats of the two signals. At 610, the lag is used to set a delay that is applied to the second audio signal before it is received at the cross-fade module. The applied delay is to compensate for the delay before the first audio signal is received at the cross-fade module. At 612, the cross-fade module makes the switch by cross-fading the output from the first audio signal to the delayed second audio signal in response to the control signal.

Figure 7:
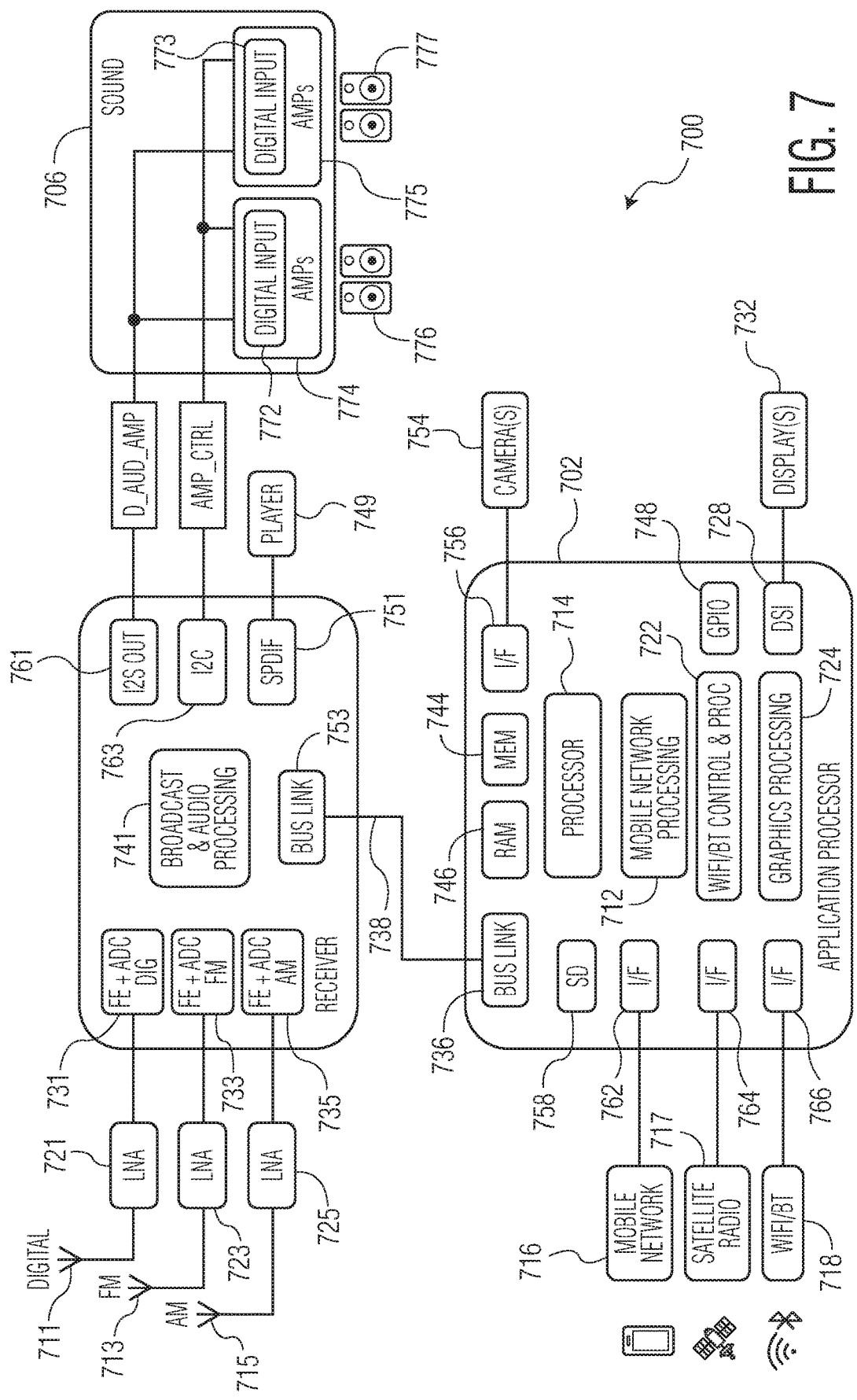
FIG. 7 depicts an example of an entertainment system.

FIG. 7 is a block diagram of an entertainment system 700 suitable for mobile, home, or business use and for use with embodiments as described above. An application processor 702 is connected through a bus link connector 736 through a bus 738 to a bus link connector 753 of a receiver 704. The applications processor may be connected through an Ethernet AVB (Audio Video Bridging) bus, a PCIe bus, a CAN (Controller Area Network) bus, an I3C bus or any other suitable bus or combination of connectors to the receiver 704. The applications processor 702 may also be connected to other devices (not shown) through one or more such bus. The receiver 704 generates audio outputs 761 and control outputs 763 to a sound module 706. The sound module includes respective digital input modules 772, 773 to generate analog audio for respective amplifiers 774, 775 to drive respective acoustic transducers 776, 777 such as loudspeakers.

The application processor 702 includes a variety of control and communications interfaces that are managed by a central processing system 714 that runs one or more applications for providing any of a variety of different functions including entertainment, communications, navigation, safety, visibility, etc. The systems and connections shown are provided as examples and there may be more or fewer. The entertainment system may include additional components and functions, such as navigation, security, and vehicle data display (not shown) or it may have far fewer components and functions than are shown.

In an embodiment, the central processor 714 within the application processor 702 is connected to mass memory 744, such as flash memory, short term memory 746, such as DDR-SDRAM (Double Data Rate Synchronous Dynamic Random-Access Memory) or other fast memory, a graphics processor 724 and display output ports, such as a DSI (Display Serial Interface) port 728 coupled to a display 732. Additional displays may also be coupled to the graphics processor and any other type of display interface may be used for one or more of the displays. The central processor may also be coupled to a GPIO (General Purpose Input Output) interface 748 which may be used to support a touch interface on one or more displays, buttons, knobs, keys, pointing devices, and any suitable combination of user input devices. In some embodiments, the application processor is controlled through peripherals connected through a USB (Universal Serial Bus) interface. A variety of other user interface modalities may be provided using the described system to suit different applications and use scenarios. The central processor may perform the functions of the controller described herein to select sources to be played on the sound module 706.

In the illustrated embodiment, the application processor 702 functions as a communications interface for external networks and complex external components. A mobile network processor 714, such as for digital cellular supports a mobile radio interface 716 to communicate with external components through the cellular network. The mobile network processor also manages security, authentication, and other functions for all of the external access facilities. In some embodiments, the mobile network interface 716 communicates only with an external smartphone. In some embodiments, the mobile network interface 716 communicates directly with the mobile network using upstream and downstream data for Internet radio connections, data, and voice connections. The mobile network interface may also provide a Wi-Fi hotspot for those using the entertainment system. The mobile network interface communicates with the mobile network processor 712 through a suitable interface port 762. Any suitable connector may be used.

A direct satellite broadcast radio 717 is coupled to the application processor 702 to receive satellite broadcasts. The satellite signal may be audio, video or both. The audio is coupled through a suitable interface 764. The satellite system is typically receive-only unlike the mobile network. Accordingly, simpler connections may be used, however, any of the external networks may be coupled using any other suitable port and interface.

A Wi-Fi and Bluetooth controller 722 allows communications with external components through Wi-Fi and Bluetooth radios 718 which may be provided on a single device. The radios 718 are also connected to the controller 722 using an interface 766. The external components may be local devices such as smart phones or other local area networks. These external components may provide additional user interface, audio sources, and audio sinks for the entertainment system.

There may be additional interfaces and connectors to other devices. These may include local short-range inter-integrated circuit (IC) communications systems such as I²C (Inter-IC) or I3C bus interface 750 nodes to communicate control and data with other components of the entertainment system and I²S (Inter-IC Sound) interface nodes to exchange music with other components. In embodiments, music from the cellular processor 712, the Wi-Fi and Bluetooth controller 722, the Ethernet adapter 736 or a CAN adapter 740 may be sent to the receiver 704 through I²S, Ethernet AVB or another interface. Similarly, music from the receiver 704 may be received through I²S and sent to any one of the above interfaces. Alternatively, USB and other connectors may be used to facilitate further user interaction and additional peripheral devices to connect to the central processor 714.

The applications processor may also be coupled to one or more cameras 754 through a suitable interface 756. The cameras may be provided as a user command input device, to provide one or more views to the outside of a vehicle or of a structure for presentation on a display 732 or for any other purpose. The camera input 756 and any other media inputs through another facility of the application processor 724 may be provided to the central processor 714 of the applications processor. The processed media may then be provided to the display 732. The application processor 702 also includes a memory card slot 758, such as an MMC (MuliMediaCard), SD (Secure Digital), microSD, CF (Compact Flash), or any other removable card slot that may hold media files to play on the entertainment system or store camera data. A similar function may be provided with a USB socket to receive a USB memory. The system may have one or both interfaces.

The applications processor 702 operates as a connection hub for a variety of different inputs and interfaces to allow the entertainment system to be controlled and to provide additional functions for the user. The applications processor receives user inputs through GPIO 748, Bluetooth 718 and other connections to select audio channels and other sources to present on the display 732 and loudspeakers 776, 777. The bus link 736 allows communications with external components. These may include vehicle control modules, inertial reference units, cameras, microphones, amplifiers and other vehicle components. Any processed media may also be transferred through a suitable bus 738 to the receiver 704 to be presented through the sound module 706.

The receiver 704 is configured to receive and process audio from a variety of sources. Three antennas 711, 713, 715 are each connected to a respective LNA (Low Noise Amplifier) 721, 723, 725. The LNA's are each coupled to demodulators 731, 733, 735 that include front-end circuitry, such as downconverters, LNAs and ADC's (Analog to Digital Converters), inter alia. The ADCs provide digitized versions of each received signal. In the illustrated embodiments, the first antenna receives a digital broadcast 711, such as the Eureka 747 DAB (Digital Audio Broadcasting) system or the IBOC (In-Band On-Channel) HD radio system transmissions, DRM (Digital Radio Mondial), CDR (China Digital Radio), or another terrestrial or satellite broadcast. The second antenna receives an analog FM signal 713 and the third antenna receives an analog AM signal 717. For some of the available transmissions, the same antenna and LNA may be shared for all three different types of signals.

The configuration of demodulators may be modified to suit different configurations or antennas and, in some embodiments, the demodulators may be reconfigurable to suit different received audio signals. More or fewer receivers may be used and other receivers may be used instead of or in addition to those shown. As examples, the analog receiver may receive shortwave, longwave, citizen's band or public service bands. The digital receiver chain may include satellite broadcast signals. A similar structure may be used for Wi-Fi, Bluetooth or other radio communication systems, although in the illustrated embodiment these are connected through the application processor 724.

The demodulated signals are each provided to a broadcast and audio processing module 741 with hardware and programmable circuitry. This processor includes such functions such as analog signal decoder, digital signal decoder, metadata extractor, such as RDS (Radio Data System), station and program information, time of day, weather, traffic, images, available channels, etc. The module 741 may also control the tuning and modulation functions of the receivers as well as extract other information including video channels from the received signals. In addition, the module is coupled to all of the audio sources of the receiver 704 to the audio sources received from the application processor 702 and to the output ports of the receiver 704.

The broadcast and audio processing module 741 performs equalization, filtering, and other signal processing operations as described herein. The cross-fade module, beat alignment modules, and delay modules may be included as a part of the is processing module. It is connected to present audio to an I²S output port 761 and control signals to an I²C output port 763. These ports are coupled to the sound module 706 to reproduce the provided audio. The broadcast and audio processing module may also transmit metadata and video through the bus 738 to the application processor 702 for presentation on a display 732. The application processor may use the received metadata to perform user interface interaction and to control the operation of the receiver 704.

The receiver 704 may also include many other additional input ports, such as an I²S input port, an I3C connector, ADC inputs and other input and output audio ports. A digital audio input ports 751 such as a S/PDIF (Sony/Philips Digital Interface) port, an AES/EBU (Audio Engineering Society/European Broadcasting Union) port or other digital input connector may be coupled to an external digital source 749, such as a disk player, a card reader, a portable digital music player, a memory device or other digital source.

The entertainment system 700 of FIG. 7 includes many redundant and configurable components that may be adapted to suit many different functions and purposes. The described embodiments may be implemented on such a system or on a more complex or simpler system. The described interfaces may be replaced or supplemented with other interfaces. Additional functions may be performed by the illustrated components and other components may be added to suit different implementations.

Embodiments of the present invention provide a mechanism to perform beat-aligned blending by correlating the beats in two different audio signals and then cross-fading the time domain amplitude to switch from one audio signal to the other. This mechanism may be applied to car radios, sound systems, audio units, audio processing units, audio amplifiers, etc. for mobile or fixed use and for consumer and professional applications.

The connections as discussed herein may be any type of connection suitable to transfer signals from or to the respective nodes, units or devices, including via intermediate devices. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, a plurality of connections may be replaced with a single connection that transfers multiple signals serially or in a time multiplexed manner. Likewise, single connections carrying multiple signals may be separated out into various different connections carrying subsets of these signals.

The described examples may be implemented on a single integrated circuit, for example in software in a digital signal processor (DSP) as part of a radio frequency integrated circuit (RFIC). Alternatively, the circuit and/or component examples may be implemented as any number of separate integrated circuits or separate devices interconnected with each other in a suitable manner. These examples may alternatively be implemented as soft or code representations of physical circuitry or of logical representations convertible into physical circuitry, such as in a hardware description language of any appropriate type.

Boundaries between the above described operations are provided as examples. Multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods described herein may be implemented using software instructions stored on a computer useable storage medium for execution by a computer. As an example, an embodiment of a computer program product includes a computer useable storage medium to store a computer readable program.

Alternatively, embodiments of the invention may be implemented entirely in hardware or in an implementation containing both hardware and software elements. In embodiments which use software, the software may include but is not limited to firmware, resident software, microcode, etc.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A controller comprising:
   a cross-fade module having a first audio input port to receive a first audio signal, a second audio input port to receive a second audio signal, an audio output port to provide an audio output signal and configured to be connected to an external audio reproduction system, and a control input port to receive a control signal used to determine whether to provide the first audio signal or the second audio signal to the audio output port, wherein the cross-fade module cross-fades the audio output signal at the audio output port from one audio signal to the other audio signal;
   a beat alignment module to cross-correlate the first audio signal and the second audio signal, to perform a search in the time domain for a beat-aligned delay corresponding to a peak in the cross-correlation, a range of the search being limited to an integer number of beats, the beat-aligned delay being between a first beat of the first audio signal and a second beat of the second audio signal to align beats of the respective signals; and
   a delay module to receive the delay and to delay at least one of the first audio signal and the second audio signal to compensate for the delay before the at least one of the first audio signal and the second audio signal are received at the respective audio input port.

2. The controller of claim 1, wherein the first audio signal and the second audio signal represent a same program received at different times through different transmission media.

3. The controller of claim 1, wherein the control signal has a first mixing factor for the first audio signal and a second mixing factor for the second audio signal and wherein the control signal increases the first mixing factor while decreasing the second mixing factor to transition the audio output to the first audio signal.

4. The controller of claim 1, further comprising:
   a time to frequency domain converter connected to receive the first and second audio signals and send frequency domain first and second audio signals to the beat alignment module,
   wherein the beat alignment module performs a cross-correlation in the frequency domain, and
   a frequency to time domain converter connected to receive the cross-correlation,
   wherein the beat alignment module determines the delay from the cross-correlation in the time domain.

5. The controller of claim 1, wherein the controller monitors a signal quality of the first audio signal and the second audio signal and sends a control signal to the cross-fade module to switch to one of the first audio signal or the second audio signal based on the monitoring.

6. The controller of claim 5, wherein the controller monitors an error rate of each respective signal as the signal quality.

7. The controller of claim 1, further comprising:
an analog radio tuner to receive an analog radio broadcast;
an analog-to-digital converter to convert the received analog radio broadcast to the first audio signal; and
an internet radio receiver to receive an internet radio broadcast and produce the second audio signal.

8. The controller of claim 1, wherein the integer number of beats is not more than eleven.

9. The controller of claim 1, wherein the beat alignment module is further to perform a search to find a closest downbeat by comparing beats to each other.

10. The controller of claim 1,
wherein the beat alignment module comprises a sequence of multiple delay gates, the output of each of which is a time shifted portion of the second audio signal,
wherein the beat alignment module is to cross-correlate by cross-correlating the first audio signal with each time shifted portion of the second audio signal and determine a magnitude for each result, and
wherein the beat alignment module is to perform a search by comparing the magnitude for each result to determine a greatest peak magnitude.

11. A method comprising:
receiving a first audio signal at a first audio input port of a cross-fade module;
receiving a second audio signal at a second audio input port of the cross-fade module;
receiving a control signal at a control input port of the cross-fade module;
cross-correlating the first audio signal and the second audio signal;
determining a lag between a first beat of the first audio signal and a second beat of the second audio signal by performing a search in the time domain for a lag corresponding to a peak in the cross-correlation, a range of the search being limited to an integer number of beats;
delaying at least one of the first audio signal and the second audio signal before it is received at the respective audio input port to compensate for the determined lag; and
reducing the output amplitude provided at an audio output port of the cross-fade module from the first audio signal while increasing the output amplitude of the second audio signal in response to the control signal, the audio output port configured to be connected to an external audio reproduction system.

12. The method of claim 11, further comprising generating the first audio signal by receiving an analog radio signal and converting the analog radio signal to a digital form as the first audio signal.

13. The method of claim 11 wherein cross-correlating comprises cross-correlating the first audio signal against the second audio signal at different lags and wherein determining a lag comprises determining a lag of a cross-correlation of the different lags with a highest correlation.

14. The method of claim 11, wherein determining a lag comprises cross-correlating the first audio signal in a frequency domain representation against the second audio signal in a frequency domain representation and converting the cross-correlation to a time domain representation to determine a lag using the cross-correlation.

15. The method of claim 14, wherein determining a lag comprises comparing peaks at different times on the time domain cross-correlation.

16. The method of claim 11, wherein performing the search comprises performing a search to find a closest downbeat by comparing beats to each other.

17. A radio receiver comprising:
a first radio tuner to receive an analog radio broadcast;
an analog-to-digital converter to convert the received analog radio broadcast to a first audio signal;
a second radio tuner to receive a second radio broadcast and produce a second audio signal;
a cross-fade module coupled to the first audio signal and to the second audio signal to switch between the first or the second audio signal as an audio output signal using a cross-fade;
a beat alignment module coupled to the first audio signal and to the second audio signal to cross-correlate the first audio signal and the second audio signal, to perform a search in the time domain for a beat-aligned delay corresponding to a peak in the cross-correlation, a range of the search being limited to an integer number of beats, the beat-aligned delay being between the first audio signal and the second audio signal to align beats of the respective signals; and
a delay module to receive the delay and to delay the second audio signal using the determined delay of the beat alignment module.

18. The radio receiver of claim 17, further comprising:
a time to frequency domain converter connected to receive the first and second audio signals and send frequency domain first and second audio signals to the beat alignment module;
wherein the beat alignment module cross-correlates the frequency domain first and second audio signals, and
a frequency to time domain converter connected to receive the cross-correlation and send a time domain cross-correlation,
wherein the beat alignment module determines the delay using the time domain cross-correlation.

19. The radio receiver of claim 17, further comprising:
a controller to select the first audio signal or the second audio signal, and
wherein the cross-fade module switches between the first and the second audio signals in response to a control signal from the controller.

20. The radio receiver of claim 19, wherein the controller compares audio signal quality of the first audio signal and the second audio signal to generate the control signal to the cross-fade module to switch to one of the first audio signal or the second audio signal based on the audio signal quality comparison.

* * * * *